US 12,142,482 B2

United States Patent
Wada et al.

(10) Patent No.: US 12,142,482 B2
(45) Date of Patent: Nov. 12, 2024

(54) VAPOR DEPOSITION METHOD AND VAPOR DEPOSITION DEVICE

(71) Applicant: SUMCO CORPORATION, Tokyo (JP)

(72) Inventors: Naoyuki Wada, Tokyo (JP); Yu Minamide, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 457 days.

(21) Appl. No.: 17/603,056

(22) PCT Filed: Feb. 7, 2020

(86) PCT No.: PCT/JP2020/004793
§ 371 (c)(1),
(2) Date: Oct. 12, 2021

(87) PCT Pub. No.: WO2020/213237
PCT Pub. Date: Oct. 22, 2020

(65) Prior Publication Data
US 2022/0199398 A1 Jun. 23, 2022

(30) Foreign Application Priority Data

Apr. 18, 2019 (JP) .................................. 2019-079124

(51) Int. Cl.
*H01L 21/02* (2006.01)
*C23C 16/44* (2006.01)
(Continued)

(52) U.S. Cl.
CPC ...... *H01L 21/0262* (2013.01); *C23C 16/4401* (2013.01); *C23C 16/54* (2013.01); *H01L 21/67201* (2013.01); *H01L 21/673* (2013.01)

(58) Field of Classification Search
None
See application file for complete search history.

(56) References Cited

U.S. PATENT DOCUMENTS

2008/0092821 A1* 4/2008 Otsuka .............. H01L 21/68757
118/728
2012/0247671 A1* 10/2012 Sugawara ......... H01J 37/32642
156/345.31
(Continued)

FOREIGN PATENT DOCUMENTS

JP       H06-13319 A       1/1994
JP       H07-335616 A      12/1995
(Continued)

OTHER PUBLICATIONS

International Search Report issued in International Patent Application No. PCT/JP2020/004793, dated Apr. 21, 2020, along with an English translation thereof.
(Continued)

*Primary Examiner* — Hsien Ming Lee
(74) *Attorney, Agent, or Firm* — Greenblum & Bernstein, P.L.C.

(57) ABSTRACT

Using the first robot, the carrier standing by in the load lock chamber is deposited into the reaction chamber without mounting the wafer before processing, and cleaning gas is supplied while the reaction chamber is maintained at a predetermined cleaning temperature, and the carrier that has been cleaned in the reaction chamber is transferred to the load lock chamber using the first robot. The carrier and susceptor are cleaned at a predetermined frequency. After that, the carrier is carried out from the reaction chamber, and the reaction gas is supplied to the reaction chamber to form a polysilicon film on the surface of the susceptor.

6 Claims, 13 Drawing Sheets

(51) Int. Cl.
    *C23C 16/54*         (2006.01)
    *H01L 21/67*         (2006.01)
    *H01L 21/673*       (2006.01)

(56) References Cited

U.S. PATENT DOCUMENTS

| | | |
|---|---|---|
| 2015/0364352 A1* | 12/2015 | Deshpande ........ H01L 21/68707 414/298 |
| 2016/0097144 A1 | 4/2016 | Nogami |
| 2017/0110352 A1 | 4/2017 | Tobin |
| 2018/0019145 A1 | 1/2018 | Sugawara |
| 2019/0109031 A1 | 4/2019 | Sugawara |

FOREIGN PATENT DOCUMENTS

| | | | | |
|---|---|---|---|---|
| JP | 2007-126310 A | | 5/2007 | |
| JP | 2012-216614 A | | 11/2012 | |
| JP | 2015053393 | * | 3/2015 | ........... H01L 21/205 |
| JP | 2016-76518 A | | 5/2016 | |

OTHER PUBLICATIONS

U.S. Appl. No. 17/601,792, filed Oct. 6, 2021.
U.S. Appl. No. 17/603,054, filed Oct. 12, 2021.

* cited by examiner

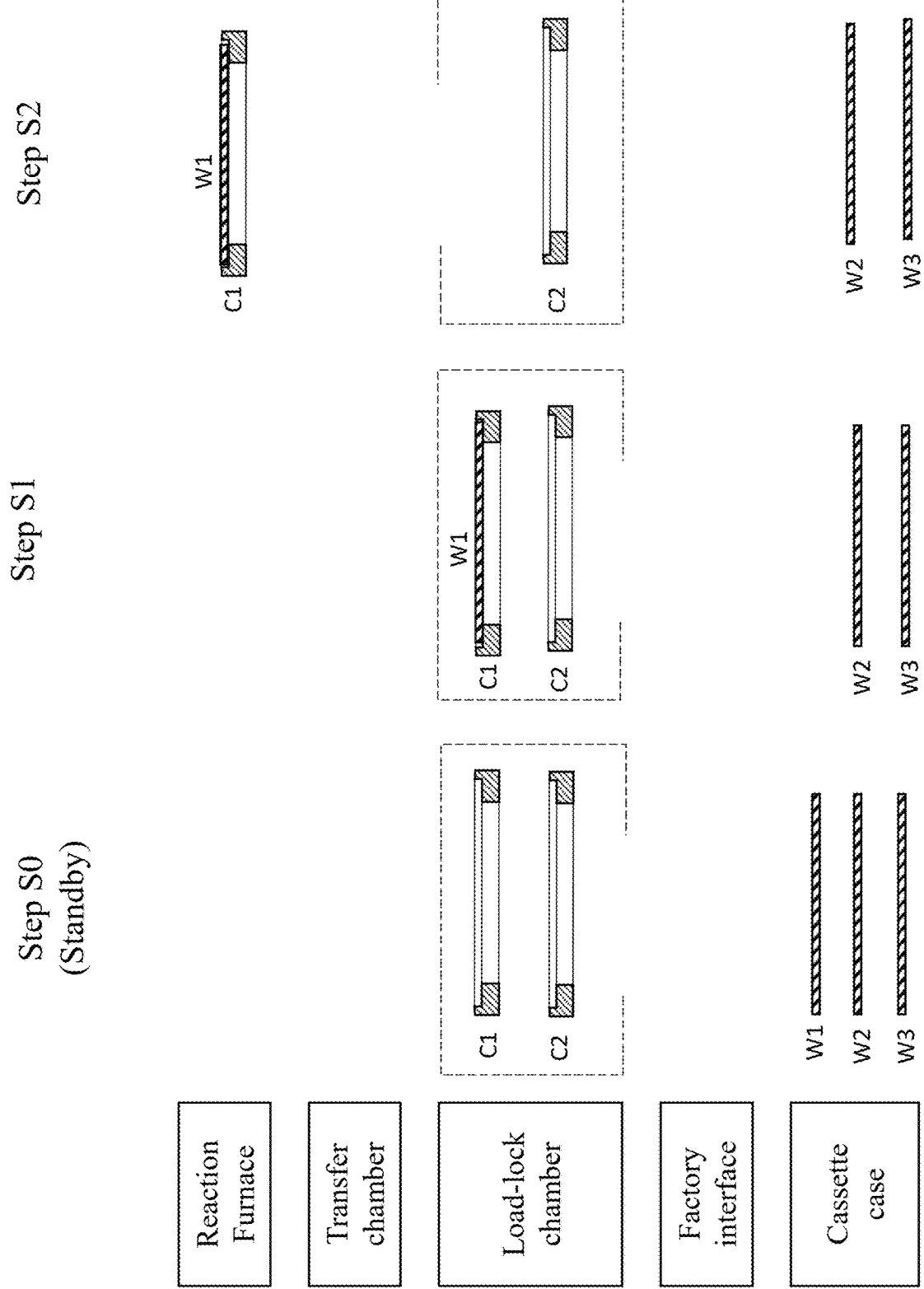

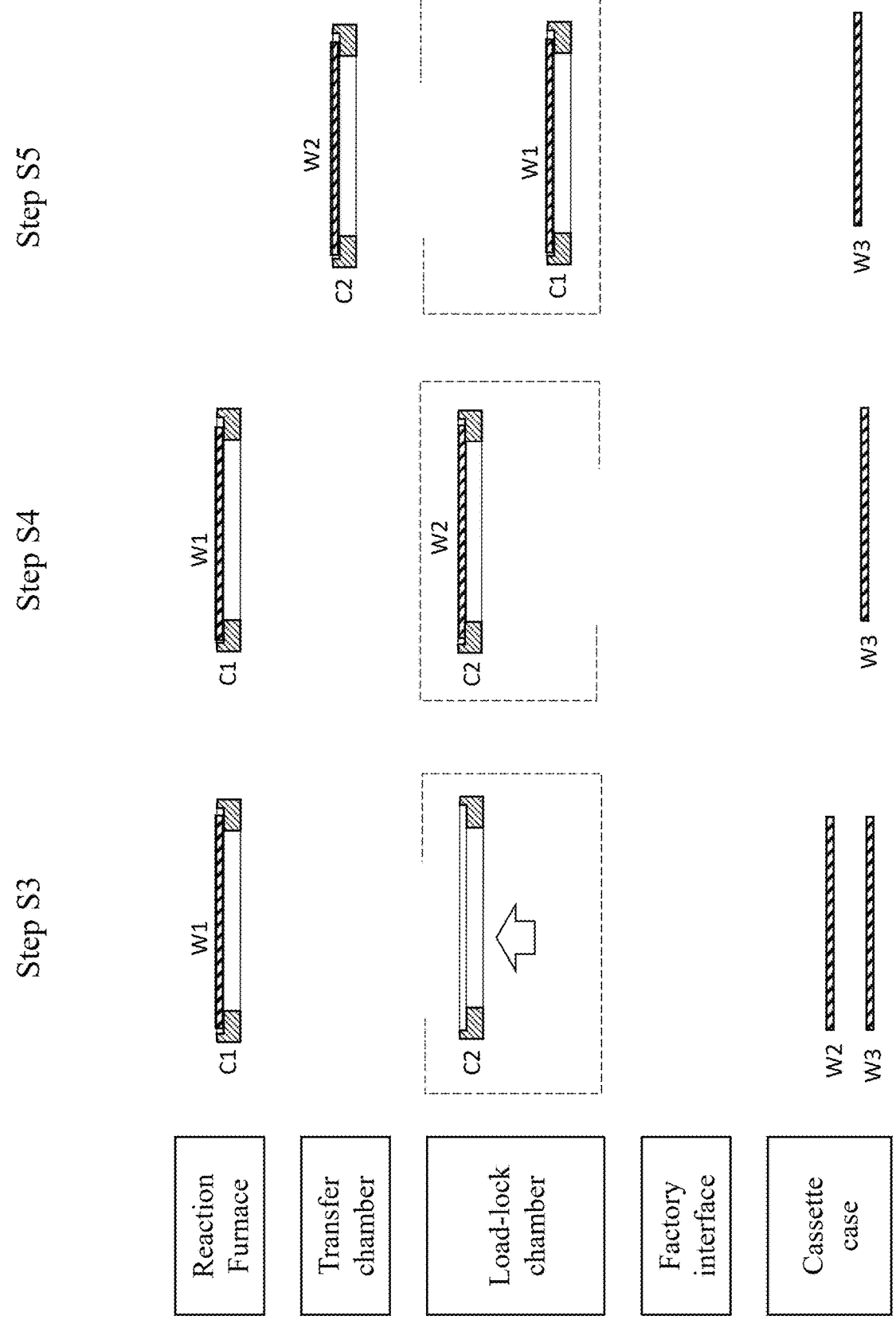

Fig. 11
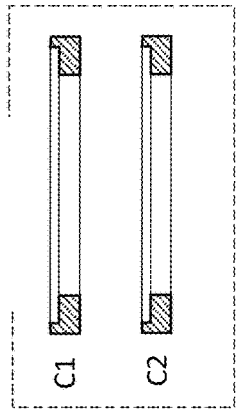
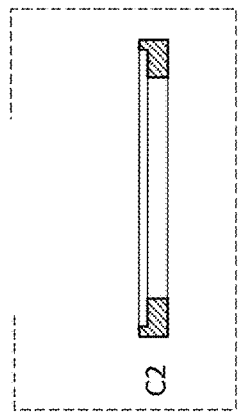
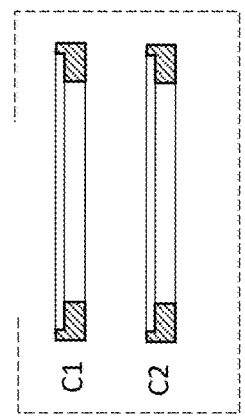

VAPOR DEPOSITION METHOD AND VAPOR DEPOSITION DEVICE

FIELD OF THE INVENTION

The present invention relates to a vapor deposition method and a vapor deposition device used in manufacturing epitaxial wafers, for example.

BACKGROUND OF THE INVENTION

In order to keep damage to a reverse face of a silicon wafer to a minimum in vapor deposition devices used in manufacturing epitaxial wafers, for example, transporting the silicon wafer through steps from a load-lock chamber to a reaction chamber in a state where the silicon wafer is mounted on a ring-shaped carrier has been proposed (Patent Literature 1).

RELATED ART

Patent Literature

Patent Literature 1: U.S. Patent Application No. 2017/0110352

SUMMARY OF THE INVENTION

Problems to be Solved by the Invention

When the production of silicon epitaxial wafers and the like is repeated using this type of the vapor deposition device, polysilicon and its decomposition products are gradually deposited not only on the inner wall of the reaction chamber but also on the surface of the carrier. After that, the deposits are peeled off from the inner wall of the reaction chamber and the surface of the carrier to become particles, and the particles float in the reaction chamber and the transfer chamber by the hot air in the reaction chamber. Since some of the particles adhere to the wafer surface, there is a problem that the quality such as electrical characteristics of the product wafer is deteriorated.

On the other hand, the susceptor tend to contain a large amount of metal impurities and is likely to be a source of contamination. Therefore, it is necessary to suppress metal contamination caused by the susceptor by coating the surface of the susceptor with a polysilicon film. It has been pointed out that the cause of the back surface deposition of the wafer is transfer (mass transfer) from the polysilicon film of the susceptor. Therefore, it has been desired to develop a vapor deposition device and method capable of suppressing defects such as contamination by particles, deposition on the back surface of the wafer, and adhesion scratches (sticking) with the wafer.

An object to be solved by the present invention is to provide a vapor deposition method and a vapor deposition device capable of suppressing contamination by particles, deposition on the back surface of a wafer, and adhesion scratches with a wafer.

Means for Solving the Problems

The present invention is a vapor deposition method using a vapor deposition device which is provided with a ring-shaped carrier that supports an outer edge of a wafer, and which uses a plurality of the carriers to transport a plurality of before-treatment wafers at least to a susceptor in a reaction chamber in which a CVD film is formed on the wafer, the method comprising:
at a predetermined frequency,
removing deposits adhering to the carrier and the susceptor; and thereafter
forming a polysilicon film on the surface of the susceptor.

More preferably, in the present invention, the vapor deposition device uses a plurality of the carriers to:
transport the plurality of before-treatment wafers, through a factory interface, a load-lock chamber and a wafer transfer chamber, to the reaction chamber in that order; and
transport a plurality of after-treatment wafers from the reaction chamber, through the wafer transfer chamber and the load-lock chamber to the factory interface in that order,
wherein the load-lock chamber communicates with the factory interface via a first door and also communicates with the wafer transfer chamber via a second door,
the wafer transfer chamber communicates, via a gate valve, with the reaction chamber,
the wafer transfer chamber is provided with a first robot that deposits the before-treatment wafer transported into the load-lock chamber into the reaction chamber in a state where the before-treatment wafer is mounted on the carrier and also withdraws the after-treatment wafer for which treatment in the reaction chamber has ended from the reaction chamber in a state where the after-treatment wafer is mounted on the carrier and transports the wafer to the load-lock chamber,
the factory interface is provided with a second robot that extracts the before-treatment wafer from a wafer storage container and mounts the wafer on the carrier standing by in the load-lock chamber, and also stores in the wafer storage container the after-treatment wafer mounted on the carrier that has been transported to the load-lock chamber, and
the load-lock chamber is provided with a holder that supports the carrier.

More preferably, in the present invention, in the reaction chamber, after removing the deposits adhering to the carrier and the susceptor, the polysilicon film is formed on the surface of the susceptor.

More preferably, in the present invention, when the polysilicon film is formed on the surface of the susceptor after removing the deposits adhering to the carrier and the susceptor, the carrier standing by in the load-lock chamber is deposited into the reaction chamber to mount on the susceptor by using the first robot in a state where the before-treatment wafer is not mounted on the carrier, cleaning gas is supplied in a state that the reaction chamber is maintained at a predetermined cleaning temperature, the carrier that has been cleaned in the reaction chamber is transported to the load lock chamber by using the first robot, and thereafter the polysilicon film is formed on the surface of the susceptor by supplying reaction gas to the reaction chamber.

The present invention is a vapor deposition device which is provided with a ring-shaped carrier that supports an outer edge of a wafer, and which uses a plurality of the carriers to transport a plurality of before-treatment wafers at least to a susceptor in a reaction chamber in which a CVD film is formed on the wafer, wherein a polysilicon film is formed on a surface of the susceptor and the polysilicon film is not formed on a surface of the carrier.

More preferably, in the present invention, the vapor deposition device uses a plurality of the carriers to:

transport the plurality of before-treatment wafers, through a factory interface, a load-lock chamber and a wafer transfer chamber, to the reaction chamber in that order; and transport a plurality of after-treatment wafers from the reaction chamber, through the wafer transfer chamber and the load-lock chamber to the factory interface in that order, wherein the load-lock chamber communicates with the factory interface via a first door and also communicates with the wafer transfer chamber via a second door, the wafer transfer chamber communicates, via a gate valve, with the reaction chamber, the wafer transfer chamber is provided with a first robot that deposits the before-treatment wafer transported into the load-lock chamber into the reaction chamber in a state where the before-treatment wafer is mounted on the carrier and also withdraws the after-treatment wafer for which treatment in the reaction chamber has ended from the reaction chamber in a state where the after-treatment wafer is mounted on the carrier and transports the wafer to the load-lock chamber, the factory interface is provided with a second robot that extracts the before-treatment wafer from a wafer storage container and mounts the wafer on the carrier standing by in the load-lock chamber, and also stores in the wafer storage container the after-treatment wafer mounted on the carrier that has been transported to the load-lock chamber, and the load-lock chamber is provided with a holder that supports the carrier.

More preferably, in the present invention, the first robot deposits the carrier standing by in the load-lock chamber into the reaction chamber to mount on the susceptor in a state where the before-treatment wafer is not mounted on the carrier, cleaning gas is supplied in a state that the reaction chamber is maintained at a predetermined cleaning temperature, the first robot transports the carrier that has been cleaned in the reaction chamber to the load lock chamber, and thereafter the polysilicon film is formed on the surface of the susceptor by supplying reaction gas to the reaction chamber.

Effect of the Invention

According to the present invention, since the polysilicon film is formed on the susceptor, wafer contamination by particles is suppressed. Further, since the polysilicon film is not formed on the carrier, it is possible to suppress the deposition on the back surface of the wafer and the adhesion scratches with the wafer.

BRIEF DESCRIPTION OF THE DRAWINGS

FIG. 7 is a diagram (no. 1) illustrating a handling protocol for the wafer and the carrier in the vapor deposition device of the embodiment.

FIG. 8 is a diagram (no. 2) illustrating the handling protocol for the wafer and the carrier in the vapor deposition device of the embodiment.

FIG. 11 is a diagram (no. 1) illustrating a cleaning and coating protocol for the carrier in the vapor deposition device of the embodiment.

Hereafter, an embodiment of the present invention is described based on the drawings. FIG. 1 is a block diagram illustrating a vapor deposition device 1 according to the embodiment of the present invention. A main body of the vapor deposition device 1 shown in the center of the diagram is illustrated in a plan view. The vapor deposition device 1 of the present embodiment is what is known as a CVD device and is provided with a pair of reaction furnaces 11, 11; a wafer transfer chamber 12 in which is installed a first robot 121 that handles a wafer WF, such as a single crystal silicon wafer; a pair of load-lock chambers 13; a factory interface 14 in which is installed a second robot 141 that handles the wafer WF; and a load robot in which is installed a wafer storage container 15 (cassette case) in which a plurality of the wafers WF are stored.

Figure 1:
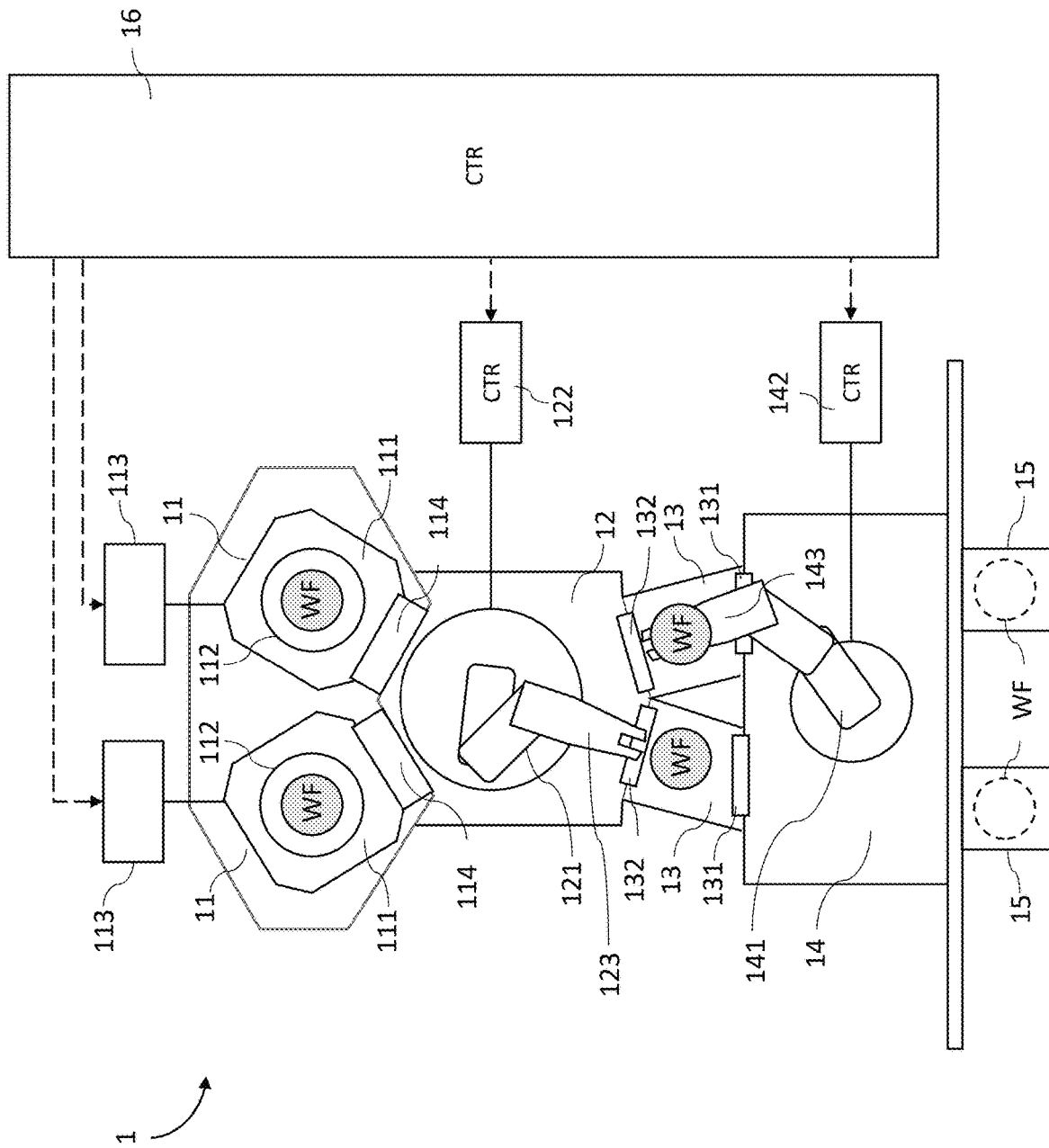
FIG. 1 is a block diagram illustrating a vapor deposition device according to an embodiment of the present invention.

The factory interface 14 is a zone configured to have the same air atmosphere as a clean room in which the wafer storage container 15 is mounted. The factory interface 14 is provided with the second robot 141, which extracts a before-treatment wafer WF that is stored in the wafer storage container 15 and deposits the wafer WF in the load-lock chamber 13, and also stores an after-treatment wafer WF transported to the load-lock chamber 13 in the wafer storage container 15. The second robot 141 is controlled by a second robot controller 142, and a second blade 143 mounted on a distal end of a robot hand displaces along a predetermined trajectory that has been taught in advance.

A first door 131 capable of opening and closing with an airtight seal is provided between the load-lock chamber 13 and the factory interface 14, while a second door 132 similarly capable of opening and closing with an airtight seal is provided between the load-lock chamber 13 and the wafer transfer chamber 12. In addition, the load-lock chamber 13 serves as a space where atmospheric gas exchange takes place between the wafer transfer chamber 12, which is configured to have an inert gas atmosphere, and the factory interface 14, which is configured to have an air atmosphere. Therefore, an exhaust device that evacuates an interior of the load lock chamber 13 to vacuum and a supply device that supplies inert gas to the load-lock chamber 13 are provided.

For example, when a before-treatment wafer WF is transported from the wafer storage container 15 to the wafer transfer chamber 12, in a state where the first door 131 on the factory interface 14 side is closed, the second door 132 on the wafer transfer chamber 12 side is closed, and the load-lock chamber 13 has an inert gas atmosphere, the wafer WF is extracted from the wafer storage container 15 using the second robot 141, the first door 131 on the factory interface 14 side is opened, and the wafer WF is transported to the load-lock chamber 13. Next, after the first door 131 on the factory interface 14 side is closed and the load-lock chamber 13 is restored to an inert gas atmosphere, the second door 132 on the wafer transfer chamber 12 side is opened and the wafer WF is transported to the wafer transfer chamber 12 using the first robot 121.

Conversely, when an after-treatment wafer WF is transported from the wafer transfer chamber 12 to the wafer storage container 15, in a state where the first door 131 on the factory interface 14 side is closed, the second door 132 on the wafer transfer chamber 12 side is closed, and the load-lock chamber 13 has an inert gas atmosphere, the second door 132 on the wafer transfer chamber 12 side is opened and the wafer WF in the wafer transfer chamber 12 is transported to the load-lock chamber 13 using the first robot 121. Next, after the second door 132 on the wafer transfer chamber 12 side is closed and the load-lock chamber 13 is restored to an inert gas atmosphere, the first door 131 on the factory interface 14 side is opened and the wafer WF is transported to the wafer storage container 15 using the second robot 141.

The wafer transfer chamber 12 is configured by a sealed chamber, connected on one side to the load-lock chamber 13 via the second door 132 that is capable of opening and closing and has an airtight seal, and connected on the other side via a gate valve 114 that is capable of opening and closing and has an airtight seal. The first robot 121, which transports the before-treatment wafer WF from the load-lock chamber 13 to the reaction chamber 111 and transports the after-treatment wafer WF from the reaction chamber 111 to the load-lock chamber 13, is installed on the wafer transfer chamber 12. The first robot 121 is controlled by a first robot controller 122, and a first blade 123 mounted on a distal end of a robot hand displaces along an operation trajectory that has been taught in advance.

An integrated controller 16 that integrates control of the entire vapor deposition device 1, the first robot controller 122, and the second robot controller 142 send and receive control signals amongst each other. In addition, when an operation command signal from the integrated controller 16 is sent to the first robot controller 122, the first robot controller 122 controls the operation of the first robot 121, and an operation result of the first robot 121 is sent from the first robot controller 122 to the integrated controller 16. Accordingly, the integrated controller 16 recognizes an operation status of the first robot 121. Similarly, when an operation command signal from the integrated controller 16 is sent to the second robot controller 142, the second robot controller 142 controls the operation of the second robot 141, and an operation result of the second robot 141 is sent from the second robot controller 142 to the integrated controller 16. Accordingly, the integrated controller 16 recognizes an operation status of the second robot 141.

Inert gas is supplied to the wafer transfer chamber 12 from an inert gas supply device not shown in the drawings, and gas in the wafer transfer chamber 12 is cleaned with a scrubber (scrubbing dust collector, precipitator) that is connected to an exhaust port, after which the gas is released outside the system. Although a detailed depiction is omitted, this type of scrubber can use a conventionally known pressurized water scrubber, for example.

The reaction furnace 11 is a device for growing an epitaxial film on a surface of the wafer WF using a CVD method, and includes a reaction chamber 111; a susceptor 112 on which the wafer WF is placed and rotated is provided inside the reaction chamber 111, and a gas supply device 113 is also provided that supplies hydrogen gas and raw material gas for growing a CVD film (when the CVD film is a silicon epitaxial film, the raw material gas may be silicon tetrachloride $SiCl_4$ or trichlorosilane $SiHCl_3$, for example) to the reaction chamber 111. In addition, although omitted from the drawings, a heat lamp for raising the temperature of the wafer WF to a predetermined temperature is provided around the circumference of the reaction chamber 111. Moreover, a gate valve 114 is provided between the reaction chamber 111 and the wafer transfer chamber 12, and airtightness with the wafer transfer chamber 12 of the reaction chamber 111 is ensured by closing the gate valve 114. Various controls, such as driving the susceptor 112 of the reaction furnace 11, supply and stoppage of gas by the gas supply device 113, turning the heat lamp on and off, and opening and closing the gate valve 114, are controlled by a command signal from the integrated controller 16. The vapor deposition device 1 shown in FIG. 1 depicts an example provided with a pair of reaction furnaces 11, 11, but the vapor deposition device 1 may have one reaction furnace 11 or three or more reaction furnaces.

A scrubber (scrubbing mist eliminator) having a similar configuration to that of the wafer transfer chamber 12 is provided to the reaction furnace 11. In other words, hydrogen gas or raw material gas or dopant gas supplied from the gas supply device 113 is cleaned by the scrubber connected to an exhaust port provided to the reaction chamber 111 and is then released outside the system. A conventionally known pressurized water scrubber, for example, can be used for this scrubber, as well.

Figure 2A:
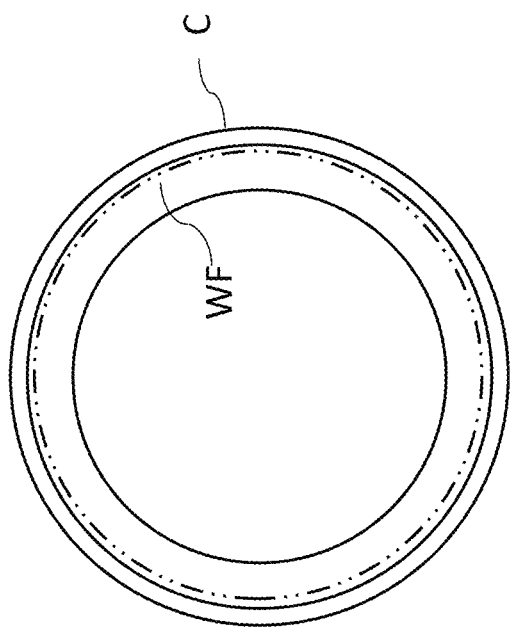
FIG. 2A is a plan view illustrating a carrier according to the embodiment of the present invention.

In the vapor deposition device 1 according to the present embodiment, the wafer WF is transported between the load-lock chamber 13 and the reaction chamber 111 using a ring-shaped carrier C that supports the entire outer circumferential edge of the wafer WF. FIG. 2A is a plan view of the carrier C, FIG. 2B is a cross-sectional view of the carrier C including the wafer WF and the susceptor 112 of the reaction furnace 11, FIG. 2C is an enlarged cross-sectional view of FIG. 2B, and FIG. 5 is a plan view and cross-sectional views illustrating a transfer protocol for the wafer WF and the carrier C within the reaction chamber 111.

Figure 2B:
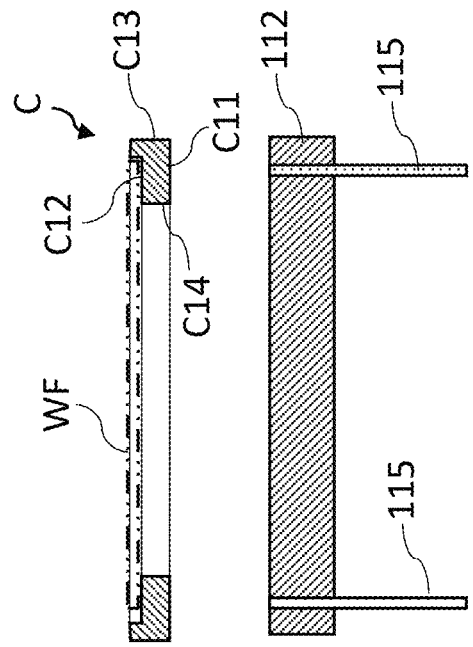
FIG. 2B is a cross-sectional view of the carrier, including a wafer and a reaction furnace susceptor.
Figure 2C:
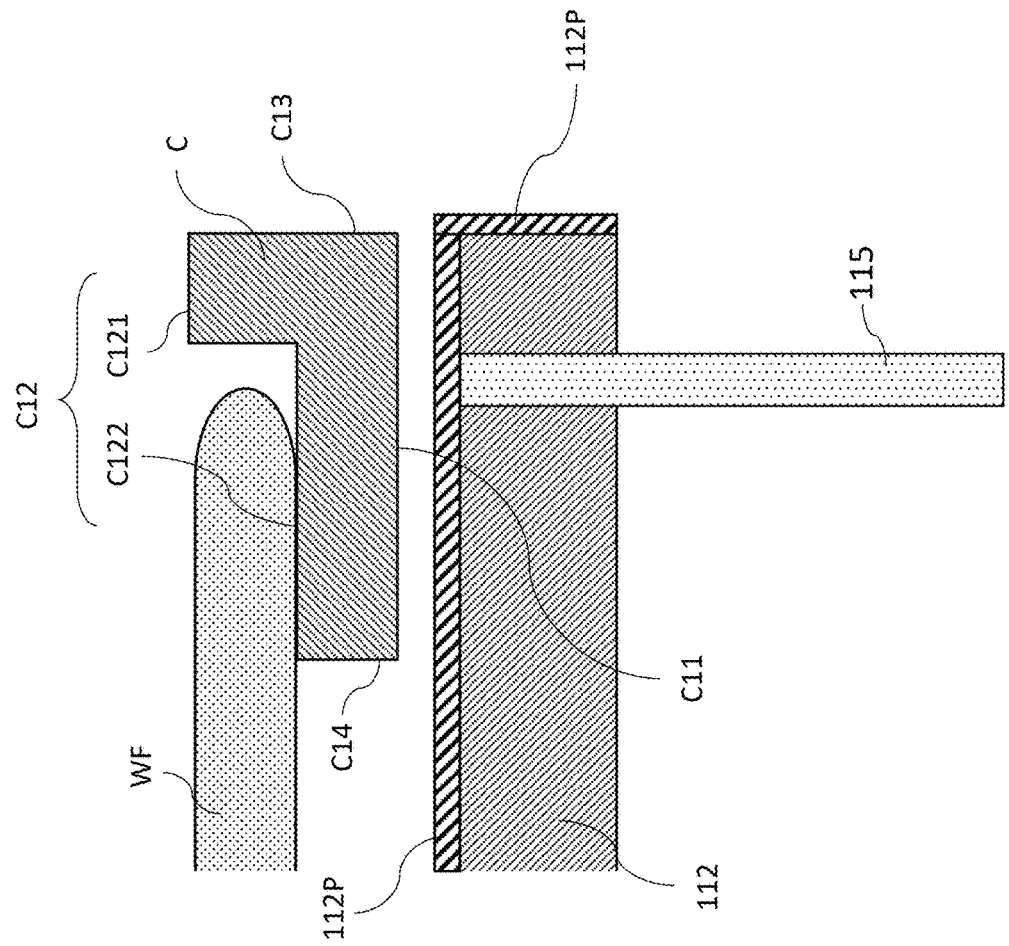
FIG. 2C is an enlarged cross-sectional view of the carrier, including a wafer and a reaction furnace susceptor.
Figure 5C:
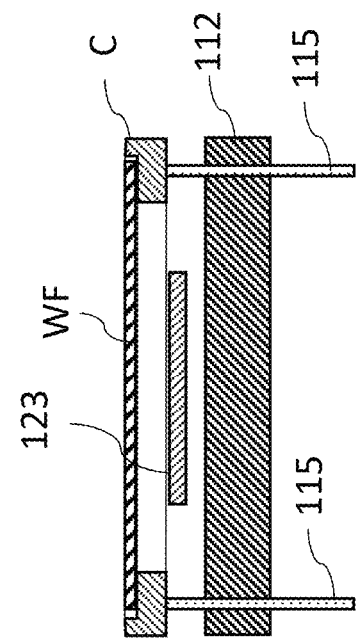
FIGS. 5A-5E are a plan view and cross-sectional views illustrating a transfer protocol for the wafer and the carrier within a reaction chamber.
Figure 5D:
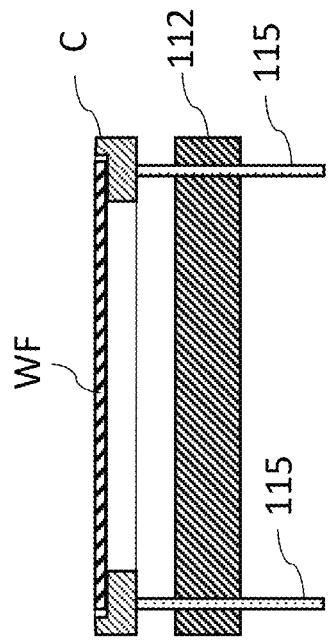
Figure 5E:
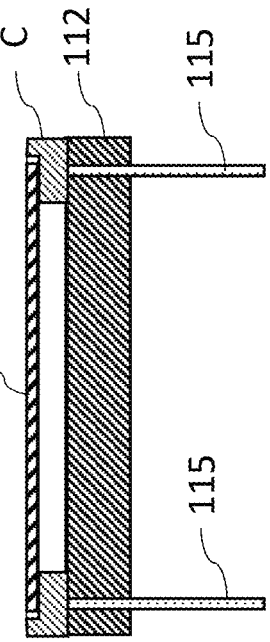
Figure 5A:
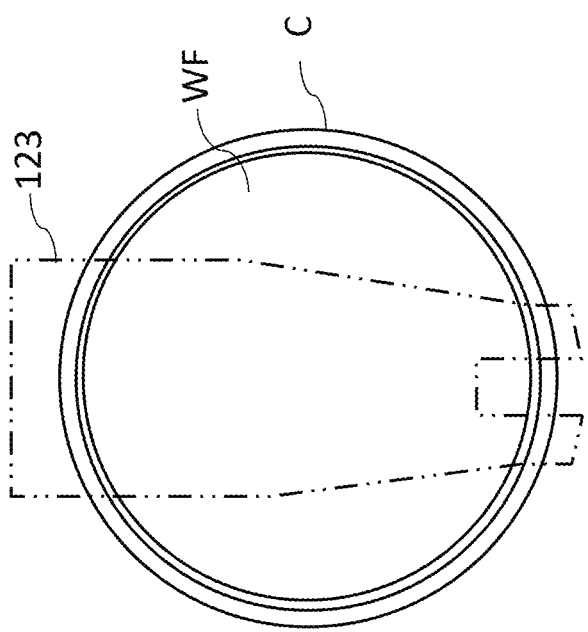
Figure 5B:
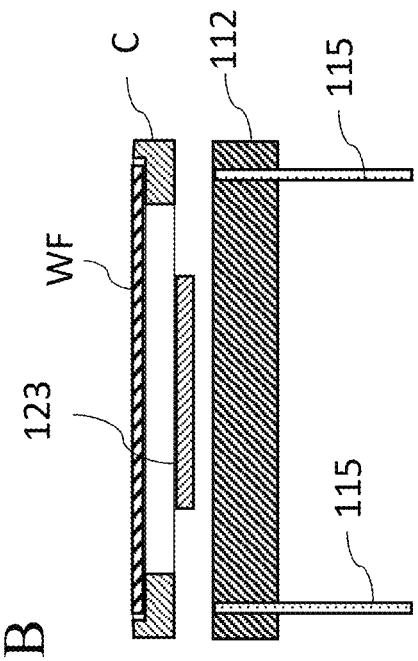

The carrier C according to the present embodiment is configured by a material such as SiC, for example; is formed in a ring shape; and includes a bottom surface C11 that rests on a top surface of the susceptor 112 shown in FIG. 2B, a top surface C12 that touches and supports the entire outer circumferential edge of a reverse face of the wafer WF, an outer circumferential wall surface C13, and an inner circumferential wall surface C14. The carrier C of the present embodiment does not have a polysilicon film formed on its surface. Even if the polysilicon film is formed on the surface of the carrier C by repeating the production of the epitaxial wafer using the silicon raw material gas, it is removed by the cleaning treatment performed between the production process and the next production process. In addition, when the wafer WF supported by the carrier C is transported into the reaction chamber 111, in a state where the carrier C rests on the first blade 123 of the first robot 121 as illustrated in the plan view of FIG. 5A, the wafer WF is transported to a top portion of the susceptor 112 as illustrated in FIG. 5B, the carrier C is temporarily lifted by three or more carrier lifting pins 115 provided to the susceptor 112 so as to be capable of displacing vertically as illustrated in FIG. 5C, and the first blade 123 is retracted as illustrated in FIG. 5D, after which the susceptor 112 is raised as illustrated in FIG. 5E, thereby placing the carrier C on the top surface of the susceptor 112. As shown in FIG. 2C, a polysilicon film 112P is formed on the surface of the susceptor 112 of the present embodiment. The polysilicon film 112P is formed in-line after the cleaning treatment. Details will be described later.

Conversely, when treatment in the reaction chamber 111 has ended for the wafer WF and the wafer WF is withdrawn in a state mounted on the carrier C, the susceptor 112 is lowered from the state illustrated in FIG. 5E and supports the carrier C with only the carrier lifting pins 115 as illustrated in FIG. 5D, the first blade 123 is advanced between the carrier C and the susceptor 112 as illustrated in FIG. 5C, and then the three carrier lifting pins 115 are lowered to rest the carrier C on the first blade 123 as illustrated in FIG. 5B, and the hand of the first robot 121 is operated. In this way, the wafer WF for which treatment has ended can be withdrawn in a state mounted on the carrier C.

Figure 3A:
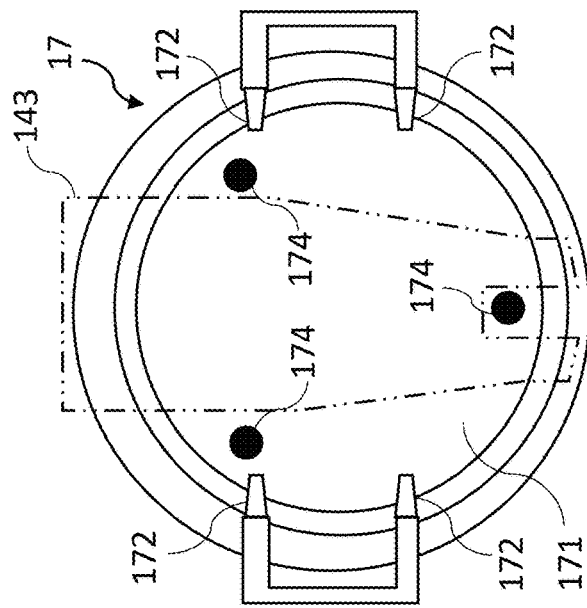
FIG. 3A is a plan view illustrating a holder provided to a load-lock chamber.
Figure 3B:
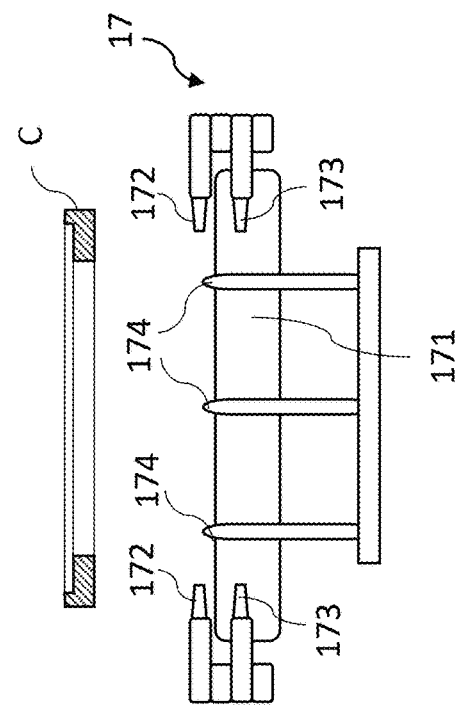
FIG. 3B is a cross-sectional view of the holder including the wafer and the carrier.

Also, in the vapor deposition device 1 according to the present embodiment, the carrier C is transported between processes running from the load-lock chamber 13 to the reaction chamber 111, and therefore in the load-lock chamber 13, the before-treatment wafer WF is placed on the carrier C and the after-treatment wafer WF is removed from the carrier C. Therefore, a holder 17 that supports the carrier C at two vertical levels is provided to the load-lock chamber 13. FIG. 3A is a plan view illustrating the holder 17 that is provided to the load-lock chamber 13, and FIG. 3B is a cross-sectional view of the holder 17 including the carrier C. The holder 17 according to the present embodiment includes a fixed holder base 171; a first holder 172 and second holder 173 that support two carriers C at two vertical levels, and that are provided to the holder base 171 so as to be capable of lifting and lowering vertically; and three wafer lifting pins 174 that are provided to the holder base 171 so as to be capable of lifting and lowering vertically.

The first holder 172 and the second holder 173 (in the plan view of FIG. 3A, the second holder 173 is obscured by the first holder 172 and therefore only the first holder 172 is depicted) have projections for supporting the carrier C at four points, and one carrier C is placed on the first holder 172 and another carrier C is placed on the second holder 173. The carrier C that rests on the second holder 173 is inserted into a gap between the first holder 172 and the second holder 173.

Figure 4A:
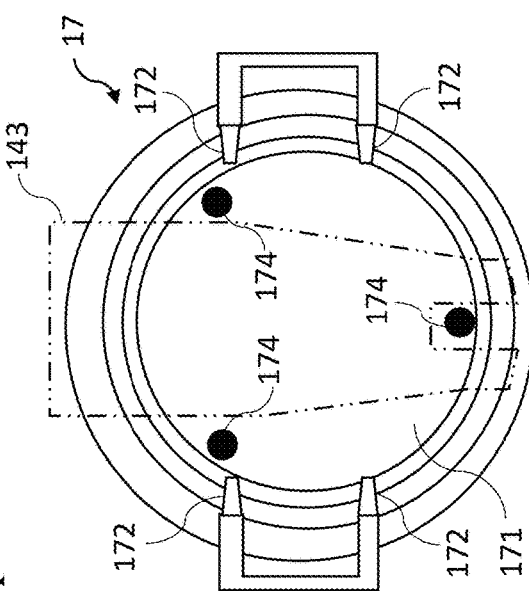
FIGS. 4A-4E are a plan view and cross-sectional views illustrating a transfer protocol for the wafer and the carrier in the load-lock chamber.
Figure 4C:
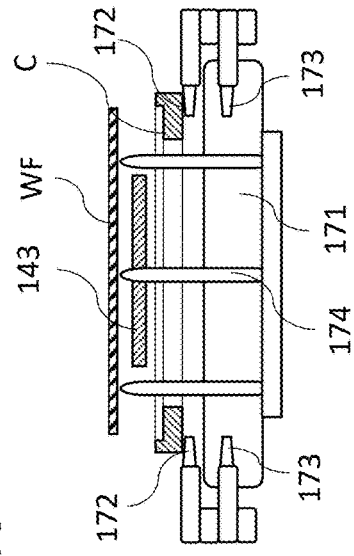
Figure 4D:
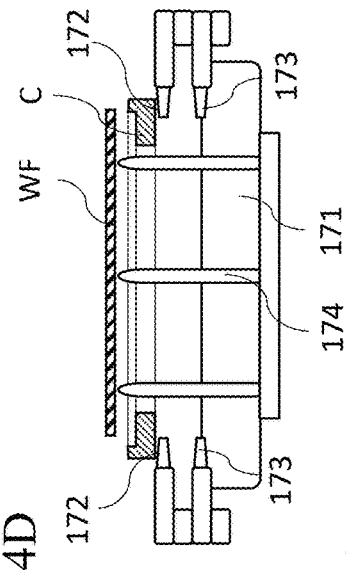
Figure 4B:
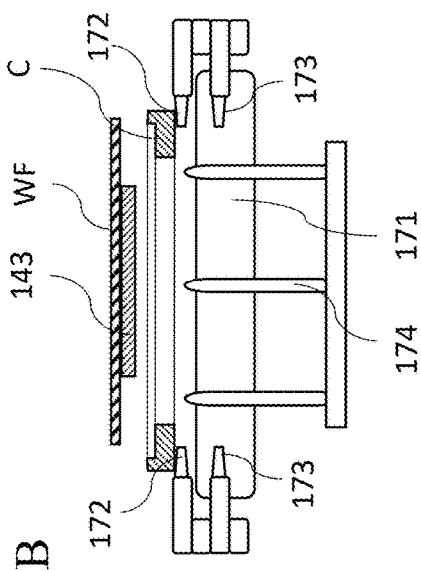

FIG. 4 is a plan view and cross-sectional views of a transfer protocol for the wafer WF and carrier C in the load-lock chamber 13 and depicts a protocol in which a before-treatment wafer WF rests on the carrier C in a state where the carrier C is supported by the first holder 172, as illustrated in FIG. 4B. In other words, the second robot 141 that is provided to the factory interface 14 loads one wafer WF that is stored in the wafer storage container 15 onto the second blade 143 and transports the wafer WF via the first door 131 of the load-lock chamber 13 to a top portion of the holder 17, as illustrated in FIG. 4B. Next, as illustrated in FIG. 4C, the three wafer lifting pins 174 are raised relative to the holder base 171 and temporarily hold up the wafer WF, and the second blade 143 is retracted as illustrated in FIG. 4D. The three wafer lifting pins 174 are provided in positions that do not interfere with the second blade 143, as illustrated in the plan view of FIG. 4A. Next, as illustrated in FIGS. 4D and 4E, the three wafer lifting pins 174 are lowered and the first holder 172 and the second holder 173 are raised, whereby the wafer WF is placed on the carrier C.

Figure 4E:
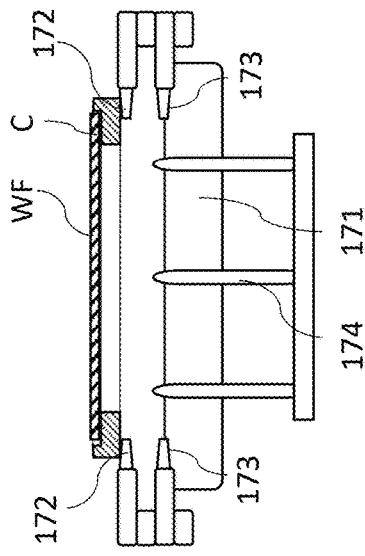

Conversely, when the after-treatment wafer WF transported to the load-lock chamber 13 in a state resting on the carrier C is transported to the wafer storage container 15, as illustrated in FIG. 4D, the three wafer lifting pins 174 are raised and the first holder 172 and the second holder 173 are lowered from the state illustrated in FIG. 4E, the wafer WF is supported by only the wafer lifting pins 174, and the second blade 143 is advanced between the carrier C and the wafer WF as illustrated in FIG. 4C, after which the three wafer lifting pins 174 are lowered to load the wafer WF on the second blade 143 as illustrated in FIG. 4B, and the hand of the second robot 141 is operated. In this way, the wafer WF for which treatment has ended can be taken out of the carrier C and into the wafer storage container 15. In the state illustrated in FIG. 4E, the wafer WF for which treatment has ended is transported to the first holder 172 in a state resting on the carrier C, but the wafer WF can be taken out of the carrier C and into the wafer storage container 15 with a similar protocol when the wafer WF is transported to the second holder 173, as well.

Figure 6A:
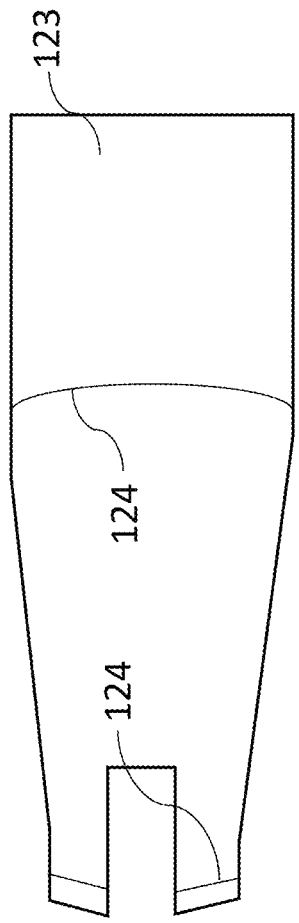
FIG. 6A is a plan view illustrating an example of a first blade attached to the tip of a hand of a first robot.
Figure 6B:
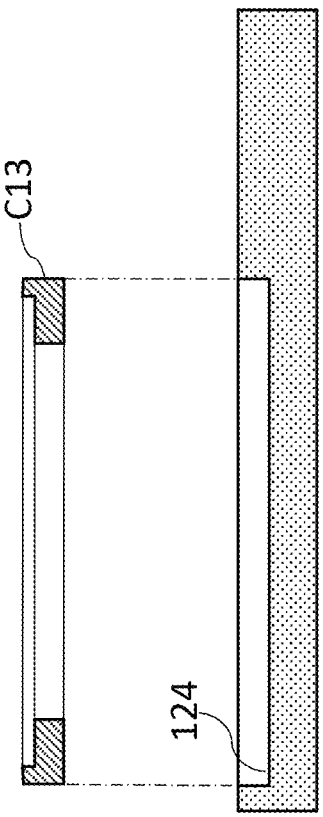
FIG. 6B is a cross-sectional view of the first blade including a carrier and a wafer.
Figure 9:
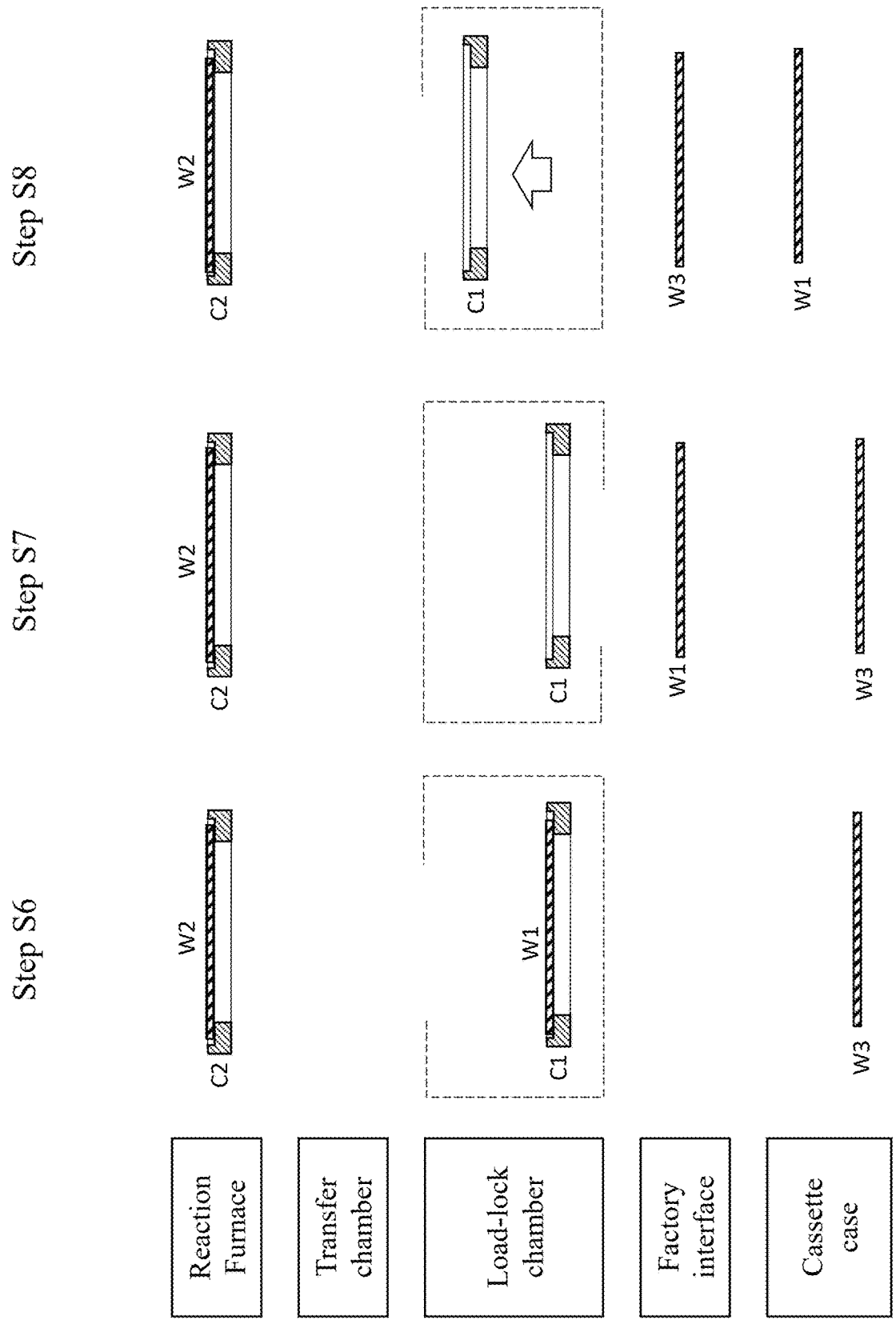
FIG. 9 is a diagram (no. 3) illustrating the handling protocol for the wafer and the carrier in the vapor deposition device of the embodiment.
Figure 10:
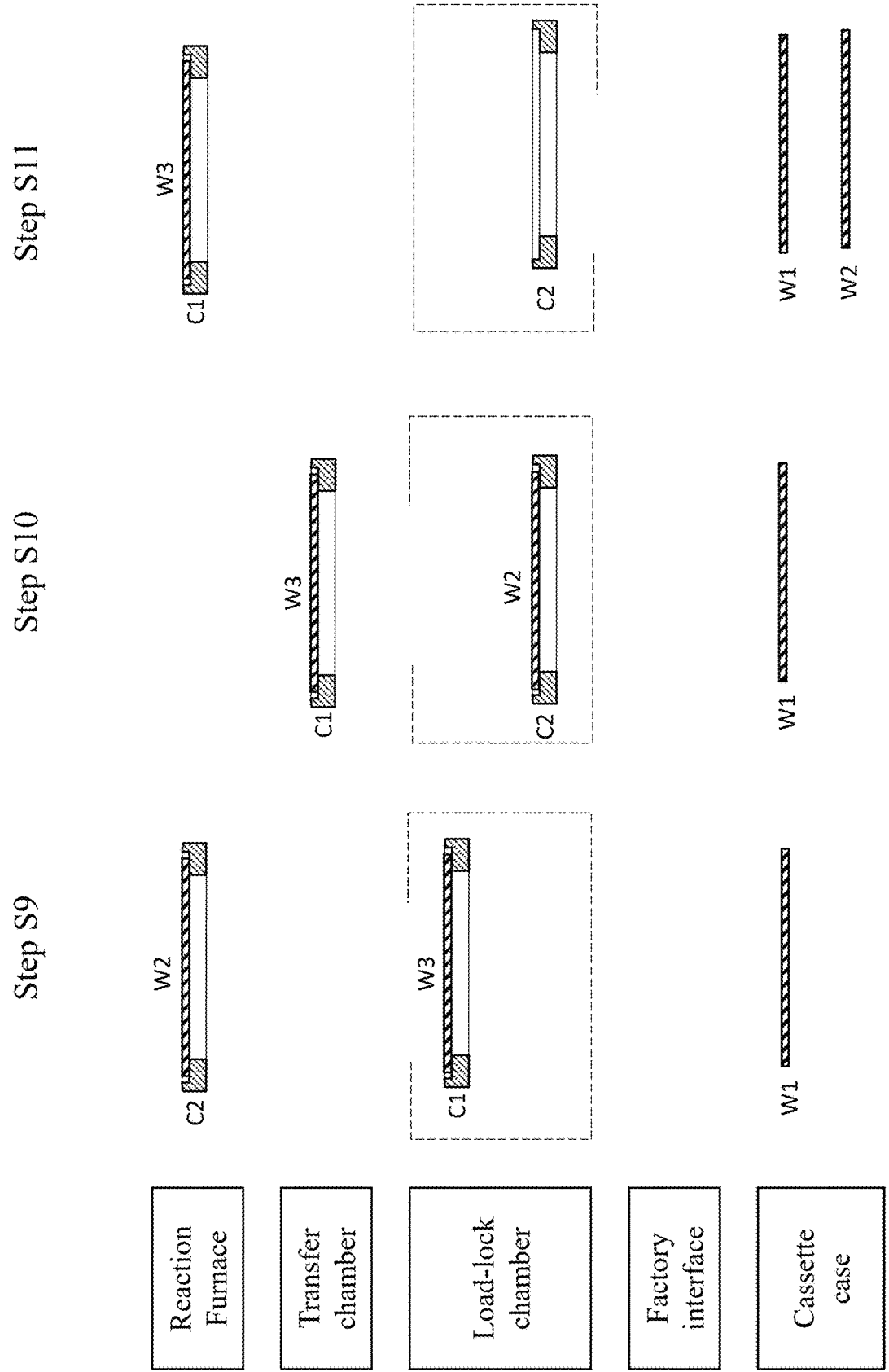
FIG. 10 is a diagram (no. 4) illustrating the handling protocol for the wafer and the carrier in the vapor deposition device of the embodiment.

FIG. 6A is a plan view illustrating an example of a first blade 123 attached to the tip of a hand of a first robot 121, FIG. 6B is a cross-sectional view of the first blade 123 including a carrier C. The first blade 123 of the present embodiment has a first recess 124 having a diameter corresponding to the outer circumferential wall surface C13 of the carrier C on one surface of a strip-shaped main body. The diameter of the first recess 124 is formed to be slightly larger than the diameter of the outer circumferential wall surface C13 of the carrier C. Then, when the first robot 121 mounts the wafer WF or transports an empty carrier C, the first robot 121 mounts the carrier C on the first recess 124.

Next a protocol is described for handling the carrier C and the wafer WF prior to creating the epitaxial film (hereafter referred to simply as "before-treatment") and after creating the epitaxial film (hereafter referred to simply as "after-treatment") in the vapor deposition device 1 according to the present embodiment. FIGS. 7 to 10 are schematic views illustrating a handling protocol for a wafer and a carrier in the vapor deposition device of the present embodiment and correspond to the wafer storage container 15 on one side of the device, the load-lock chamber 13, and the reaction furnace 11 in FIG. 1; a plurality of wafers W1, W2, W3, . . . (for example, a total of 25 wafers) are stored in the wafer storage container 15 and treatment is initiated in that order.

Step S0 in FIG. 7 shows a standby state from which treatment using the vapor deposition device 1 is to begin, and has the plurality of wafers W1, W2, W3, . . . (for example, a total of 25 wafers) stored in the wafer storage container 15, has an empty carrier C1 supported by the first holder 172 of the load-lock chamber 13, has an empty carrier C2 supported by the second holder 173, and has an inert gas atmosphere in the load-lock chamber 13.

In the next step (step S1), the second robot 141 loads the wafer W1 that is stored in the wafer storage container 15 onto the second blade 143 and transfers the wafer W1 through the first door 131 of the load-lock chamber 13 to the carrier C1 that is supported by the first holder 172. The protocol for this transfer was described with reference to FIG. 4.

In the next step (step S2), the first door 131 of the load-lock chamber 13 is closed and, in a state where the second door 132 is also closed, the interior of the load-lock chamber 13 undergoes gas exchange to the inert gas atmosphere again. Then, the second door 132 is opened, the carrier C1 is loaded onto the first blade 123 of the first robot 121, the gate valve 114 of the reaction furnace 11 is opened, and the carrier C1 on which the wafer W1 is mounted is transferred through the gate valve 114 to the susceptor 112. The protocol for this transfer was described with reference to FIG. 4. In steps S2 to S4, the CVD film creation process is performed on the wafer W1 in the reaction furnace 11.

In other words, the carrier C1 on which the before-treatment wafer W1 is mounted is transferred to the susceptor 112 of the reaction chamber 111 and the gate valve 114 is closed, and after waiting a predetermined amount of time, the gas supply device 113 supplies hydrogen gas to the reaction chamber 111, giving the reaction chamber 111 a hydrogen gas atmosphere. Next, the wafer W1 in the reaction chamber 111 is heated to a predetermined temperature by the heat lamp and pretreatment such as etching or heat treatment is performed as necessary, after which the gas supply device 113 supplies raw material gas and dopant gas while controlling the flow volume and/or supply time. This creates a CVD film on the surface of the wafer W1. Once the CVD film is formed, the gas supply device 113 once again supplies the reaction chamber 111 with hydrogen gas and the reaction chamber undergoes gas exchange to a hydrogen gas atmosphere, after which the protocol stands by for a predetermined amount of time.

While the reaction furnace 11 is treating the wafer W1 in steps S2 to S4, the second robot 141 extracts the next wafer (W2) from the wafer storage container 15 and prepares for the next treatment. Prior to this, in step S3 in the present embodiment, the second door 132 of the load-lock chamber 13 is closed, and in a state where the first door 131 is also closed, the interior of the load-lock chamber 13 undergoes gas exchange to an inert gas atmosphere. Then, the second door 132 is opened, the carrier C2 supported by the second holder 173 is transferred to the first holder 172 by the first robot 121, and the second door 132 is closed. Subsequently, in step S4, the second robot 141 loads the wafer W2 that was stored in the wafer storage container 15 onto the second blade 143, the first door 131 is opened, and the wafer W2 is transferred to the carrier C2 that is supported by the first holder 172 of the load-lock chamber 13.

In this way, in the present embodiment, step S3 is added and the before-treatment wafer WF that was stored in the wafer storage container 15 is mounted on the first holder 172, which is the topmost-level holder of the holder 17 of the load-lock chamber 13. This is for the following reasons. Specifically, as illustrated in step S2, when the empty carrier C2 on which the next wafer W2 is to be mounted is supported by the second holder 173, once the wafer W2 is mounted on the carrier C2, there is a possibility that the carrier C1 on which the after-treatment wafer W1 is mounted may be transferred to the first holder 172. The carrier C of the vapor deposition device 1 according to the present embodiment is transported to the reaction chamber 111, and therefore the carrier C is a factor in particle production, and when the carrier C1 is held above the before-treatment wafer W2, dust may fall on the before-treatment wafer W2. Therefore, step S3 is added and the empty carrier C2 is transferred to the first holder 172 so that the before-treatment wafer WF is mounted on the topmost-level holder (first holder 172) of the holder 17 of the load-lock chamber 13.

In step S5, the first door 131 of the load-lock chamber 13 is closed and, in a state where the second door 132 is also closed, the interior of the load-lock chamber 13 undergoes gas exchange to an inert gas atmosphere. Then, the gate valve 114 of the reaction furnace 11 is opened, the first blade 123 of the first robot 121 is inserted into the reaction chamber 111 and is loaded with the carrier C1 on which the after-treatment wafer W1 is mounted, the carrier C1 is withdrawn from the reaction chamber 111, and the gate valve 114 is closed, after which the second door 132 is opened and the carrier C1 is transferred to the second holder 173 of the load-lock chamber 13. Subsequently, the carrier C2 supported by the first holder 172 is loaded onto the first blade 123 of the first robot 121 and, as illustrated in step S6, the gate valve 114 is opened and the carrier C2 on which the before-treatment wafer W2 is mounted is transferred through the wafer transfer chamber 12 to the susceptor 112 of the reaction furnace 11.

In steps S6 to S9, the CVD film creation process is performed on the wafer W2 in the reaction furnace 11. In other words, the carrier C2 on which the before-treatment wafer W2 is mounted is transferred to the susceptor 112 of the reaction chamber 111 and the gate valve 114 is closed, and after waiting a predetermined amount of time, the gas supply device 113 supplies hydrogen gas to the reaction chamber 111, giving the reaction chamber 111 a hydrogen gas atmosphere. Next, the wafer W2 in the reaction chamber 111 is heated to a predetermined temperature by the heat lamp and pretreatment such as etching or heat treatment is performed as necessary, after which the gas supply device 113 supplies raw material gas while controlling the flow volume and/or supply time. This creates a CVD film on the surface of the wafer W2. Once the CVD film is formed, the gas supply device 113 once again supplies the reaction chamber 111 with hydrogen gas and the reaction chamber 111 undergoes gas exchange to a hydrogen gas atmosphere, after which the protocol stands by for a predetermined amount of time.

In this way, while the reaction furnace 11 is treating the wafer W2 in steps S6 to S9, the second robot 141 stores the after-treatment wafer W1 in the wafer storage container 15 and also extracts the next wafer (W3) from the wafer storage container 15 and prepares for the next treatment. In other words, in step S7, the second door 132 of the load-lock chamber 13 is closed, and in a state where the first door 131 is also closed, the interior of the load-lock chamber 13 undergoes gas exchange to an inert gas atmosphere. Then, the first door 131 is opened, the second robot 141 loads the after-treatment wafer W1 onto the second blade 143 from the carrier C1 supported by the second holder 173 and, as illustrated in step S8, the after-treatment wafer W1 is stored in the wafer storage container 15. Subsequently, similarly to step S3 described above, in step S8, the first door 131 of the load-lock chamber 13 is closed, and in a state where the second door 132 is also closed, the interior of the load-lock chamber 13 undergoes gas exchange to an inert gas atmosphere. Then, the second door 132 is opened and the carrier C1 supported by the second holder 173 is transferred to the first holder 172 by the first robot 121.

Subsequently, in step S9, the second door 132 of the load-lock chamber 13 is closed, and in a state where the first door 131 is also closed, the interior of the load-lock chamber 13 undergoes gas exchange to an inert gas atmosphere. Then, the second robot 141 loads the wafer W3 that was stored in the wafer storage container 15 onto the second blade 143 and, as illustrated in step S9, the first door 131 is opened and the wafer W3 is transferred to the carrier C1 that is supported by the first holder 172 of the load-lock chamber 13.

In step S10, similarly to step S5 described above, the first door 131 of the load-lock chamber 13 is closed, and in a state where the second door 132 is also closed, the interior of the load-lock chamber 13 undergoes gas exchange to an inert gas atmosphere. Then, the gate valve 114 of the reaction furnace 11 is opened, the first blade 123 of the first robot 121 is inserted into the reaction chamber 111 and is loaded with the carrier C2 on which the after-treatment wafer W2 is mounted, and the gate valve 114 is closed, after which the second door 132 is opened and the carrier C2 is transferred from the reaction chamber 111 to the second holder 173 of the load-lock chamber 13. Subsequently, the carrier C1 supported by the first holder 172 is loaded onto the first blade 123 of the first robot 121 and, as illustrated in step S11, the carrier C1 on which the before-treatment wafer W3 is mounted is transferred through the wafer transfer chamber 12 to the susceptor 112 of the reaction furnace 11.

In step S10, similarly to step S7 described above, the second door 132 of the load-lock chamber 13 is closed, and in a state where the first door 131 is also closed, the interior of the load-lock chamber 13 undergoes gas exchange to an inert gas atmosphere. Then, the first door 131 is opened, the second robot 141 loads the post-treatment wafer W2 onto the second blade 143 from the carrier C2 that is supported on the second holder 173 and, as illustrated in step S11, the post-treatment wafer W2 is stored in the wafer storage container 15. Thereafter, the above steps are repeated until treatment for all of the before-treatment wafers WF stored in the wafer storage container 15 ends.

As described above, in the vapor deposition device 1 according to the present embodiment, while treatment is ongoing in the reaction furnace 11, the next before-treatment wafer WF is extracted from the wafer storage container 15 and prepared, the after-treatment wafer WF is stored in the wafer storage container 15, and the like, and so the amount of time consumed simply in transport is drastically reduced. In such a case, when a number of standby carriers C in the load lock chamber 13 is set to two or more, as with the holder 17 in the present embodiment, a degree of freedom in shortening the amount of time consumed simply in transport can be substantially increased. Furthermore, when the space dedicated to the load-lock chamber 13 is considered, aligning the plurality of carriers C in multiple vertical levels reduces the space dedicated to the vapor deposition device 1 overall as compared to aligning the plurality of carriers C left-to-right. But, when the plurality of carriers C are aligned in multiple vertical levels, the carrier C may be held above a before-treatment wafer WF and dust may fall on the before-treatment wafer WF. However, in the vapor deposition device 1 according to the present embodiment, steps S3 and S8 are added and the empty carrier C2 is transferred to the first holder 172 so that the before-treatment wafer WF is mounted on the topmost-level holder (first holder 172) of the holder 17 of the load-lock chamber 13, and therefore the before-treatment wafer WF is mounted on the topmost-level carrier C. As a result, particles originating from the carrier C can be inhibited from adhering to the wafer WF and LPD quality can be improved.

Figure 12:
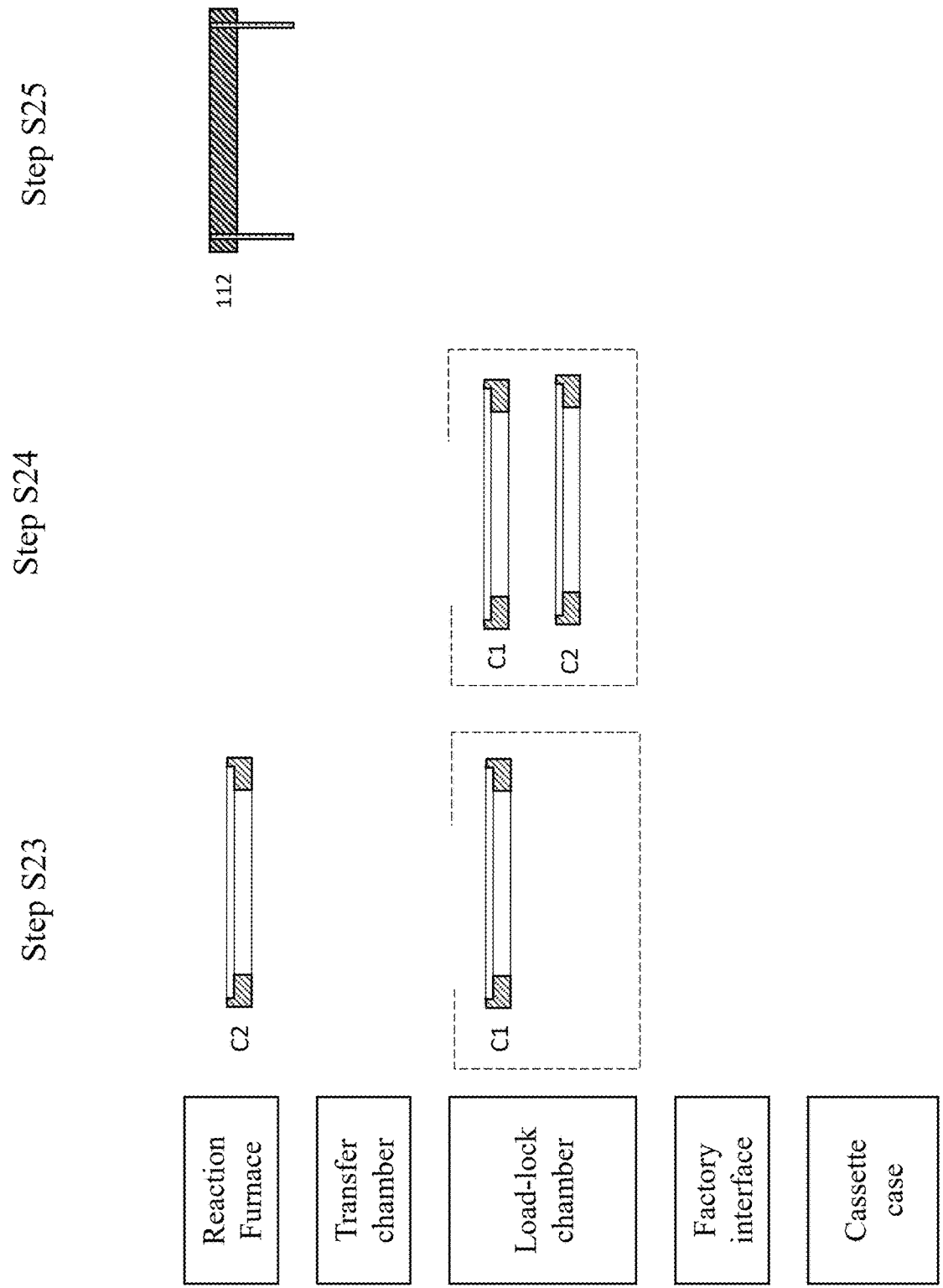
FIG. 12 is a diagram (no. 2) illustrating a cleaning and coating protocol for the carrier in the vapor deposition device of the embodiment.

When the production of a plurality of polysilicon epitaxial wafers is repeated by the above procedure, polysilicon due to the reaction gas and its decomposition products are gradually deposited at not only the inner wall of the reaction chamber 111 and the susceptor 112 but also the surface of the carrier C on which the wafer WF is mounted and deposited into the reaction chamber 111. In order to remove this deposit on a regular basis, the reaction chamber 111 and the carrier C are cleaned at a predetermined frequency. From the viewpoint of suppressing deposition on the back surface of the wafer caused by mass transfer and suppressing adhesion scratches with the wafer, it is desirable not to form a polysilicon film on the surface of the carrier C. On the other hand, it is desirable to form a polysilicon film 112P (see FIG. 2C) on the surface of the susceptor 112 in order to suppress contamination of the wafer by particles. FIGS. 11 and 12 are views showing a cleaning and coating procedure of the carrier C in the vapor deposition device 1 of the present embodiment.

Step S20 of FIG. 11 shows a standby state in which the vapor deposition process such as a formation of the epitaxial layer is completed and the cleaning process is started. It is assumed that the first holder 172 of the load lock chamber 13 supports an empty carrier C1, the second holder 173 supports an empty carrier C2, and the load lock chamber 13 has an inert gas atmosphere.

In the next step S21, the second door 132 of the load lock chamber 13 is opened, the carrier C1 which is empty is placed on the first blade 123 of the first robot 121, the gate valve 114 of the reaction furnace 11 is opened, and the carrier C1 is transferred to the susceptor 112 through the gate valve 114. The procedure for this transfer is as described with reference to FIG. 4. In this step S21, in the reaction furnace 11, cleaning treatment is performed on the inner wall of the chamber of the carrier C1 and the reaction chamber 111, the susceptor 112, and the like. The cleaning process of this example is performed by an etching process.

That is, the empty carrier C1 is transferred to the susceptor 112 in the reaction chamber 111, the gate valve 114 is closed, the reaction chamber 111 is heated to a predetermined cleaning temperature (for example, 1190° C.) by a heating lamp, and etching gas such as hydrogen chloride HCl is supplied by the gas supply device 113 at a predetermined flow rate for a predetermined time. As a result, polysilicon and its decomposition products deposited on the surface of the carrier C1, the inner wall of the chamber of the reaction chamber 111 and the surface of the susceptor 112 are etched (melted out).

When the cleaning process by etching is completed, the gate valve 114 of the reaction furnace 11 is opened, the first blade 123 of the first robot 121 is inserted into the reaction chamber 111, the carrier C1 after the cleaning process is placed on the first blade 123, and the carrier C1 is taken out from the reaction chamber 111. After closing the valve 114, the second door 132 is opened and the carrier C1 is transferred to the first holder 172 of the load lock chamber 13 (step S22). Following this, an empty carrier C2 supported by the second holder 173 is placed on the first blade 123 of the first robot 121, the gate valve 114 is opened, and the carrier C2 is transferred to the susceptor 112 in the reaction furnace 11 via the wafer transfer chamber 12 as shown in step S23 of FIG. 12.

In this step S23, in the reaction furnace 11, cleaning treatment is performed on the carrier C2, the inner wall of the chamber of the reaction chamber 111, the susceptor 112, and the like. That is, the empty carrier C2 is transferred to the susceptor 112 in the reaction chamber 111, the gate valve 114 is closed, the reaction chamber 111 is heated to a predetermined cleaning temperature (for example, 1190° C.) by a heating lamp, and etching gas such as hydrogen chloride HCl is supplied by the gas supply device 113 at a predetermined flow rate for a predetermined time. As a result, poly silicon and its decomposition products deposited on the surface of the carrier C2, the inner wall of the chamber of the reaction chamber 111, and the surface of the susceptor 112 are etched (melted out).

When the cleaning process is completed, the gate valve 114 of the reaction furnace 11 is opened, the first blade 123 of the first robot 121 is inserted into the reaction chamber 111, the carrier C2 after the cleaning process is placed on the first blade 123, and the carrier C2 is taken out from the reaction chamber 111. After closing the valve 114, the second door 132 is opened and the carrier C2 is transferred to the second holder 173 of the load lock chamber 13 (step S24). By the above steps S20 to S24, the cleaning process in the reaction furnace 11 including the pair of carriers C1 and C2 is completed. As a result, a carrier C having no polysilicon film formed on its surface can be obtained.

In the next step S25, hydrogen gas is supplied to the reaction chamber 111 in which the gate valve 114 is closed by the gas supply device 113 to make the reaction chamber 111 a hydrogen gas atmosphere. Next, the reaction chamber 111 is heated to a predetermined temperature by a heating lamp (for example, 1130° C.), and the raw material gas is supplied by the gas supply device 113 while controlling the flow rate and/or the supply time. As a result, the polysilicon film 112P is formed on the surface of the susceptor 112. At the same time, a polysilicon film is also formed on the inner wall of the reaction chamber 111. When the polysilicon film is formed on the surface of the susceptor 112, the gas supply device 113 supplies hydrogen gas to the reaction chamber 111 again to replace the reaction chamber 111 with a hydrogen gas atmosphere. As a result, the susceptor 112 having the polysilicon film 112P formed on the surface is obtained.

DESCRIPTION OF REFERENCE NUMERALS

1 . . . Vapor deposition device
11 . . . Reaction furnace
111 . . . Reaction chamber
112 . . . Susceptor
112P . . . Poly silicon film
113 . . . Gas supply device
114 . . . Gate valve
115 . . . Carrier lifting pin
12 . . . Wafer transfer chamber
121 . . . First robot
122 . . . First robot controller
123 . . . First blade
124 . . . First recess
13 . . . Load-lock chamber
131 . . . First door
132 . . . Second door
14 . . . Factory interface
141 . . . Second robot
142 . . . Second robot controller
143 . . . Second blade
15 . . . Wafer storage container
16 . . . Integrated controller
17 . . . Holder
171 . . . Holder base
172 . . . First holder
173 . . . Second holder
174 . . . Wafer lifting pin
C . . . Carrier
C11 . . . Bottom surface
C12 . . . Top surface
C13 . . . Outer circumferential wall surface
C14 . . . Inner circumferential wall surface
WF . . . Wafer

The invention claimed is:

1. A vapor deposition method using a vapor deposition device which is provided with a ring-shaped carrier that supports an outer edge of a wafer, and which uses a plurality of the carriers to transport a plurality of before-treatment wafers at least to a susceptor in a reaction chamber in which a CVD film is formed on the wafer, the method comprising:
at a frequency,
removing deposits adhering to the carrier, the reaction chamber, and the susceptor by supplying a cleaning gas into the reaction chamber; and thereafter
forming a polysilicon film on the surface of the susceptor.

2. The vapor deposition method according to claim 1, which the vapor deposition device uses a plurality of the carriers to:
transport the plurality of before-treatment wafers, through a factory interface, a load-lock chamber and a wafer transfer chamber, to the reaction chamber in that order; and
transport a plurality of after-treatment wafers from the reaction chamber, through the wafer transfer chamber and the load-lock chamber to the factory interface in that order,
wherein the load-lock chamber communicates with the factory interface via a first door and also communicates with the wafer transfer chamber via a second door,
the wafer transfer chamber communicates, via a gate valve, with the reaction chamber,
the wafer transfer chamber is provided with a first robot that deposits the before-treatment wafer transported into the load-lock chamber into the reaction chamber in a state where the before-treatment wafer is mounted on the carrier and also withdraws the after-treatment wafer for which treatment in the reaction chamber has ended from the reaction chamber in a state where the after-treatment wafer is mounted on the carrier and transports the after-treatment wafer to the load-lock chamber,
the factory interface is provided with a second robot that extracts the before-treatment wafer from a wafer storage container and mounts the before-treatment wafer on the carrier standing by in the load-lock chamber, and also stores in the wafer storage container the after-treatment wafer mounted on the carrier that has been transported to the load-lock chamber, and
the load-lock chamber is provided with a holder that supports the carrier.

3. The vapor deposition method according to claim 2, wherein when the polysilicon film is formed on the surface of the susceptor after removing the deposits adhering to the carrier and the susceptor, the carrier standing by in the load-lock chamber is deposited into the reaction chamber to mount on the susceptor by using the first robot in a state where the before-treatment wafer is not mounted on the carrier, the cleaning gas is supplied in a state that the reaction chamber is maintained at a cleaning temperature, the carrier that has been cleaned in the reaction chamber is transported to the load lock chamber by using the first robot, and thereafter the polysilicon film is formed on the surface of the susceptor by supplying reaction gas to the reaction chamber.

4. A vapor deposition device which is provided with a ring-shaped carrier that supports an outer edge of a wafer, and which uses a plurality of the carriers to transport a plurality of before-treatment wafers at least to a susceptor in a reaction chamber in which a CVD film is formed on the wafer, wherein a gas supplier is configured to supply a cleaning gas into the reaction chamber to remove deposits adhering to the carrier, the reaction chamber, and the susceptor, and a polysilicon film is formed on a surface of the susceptor and the polysilicon film is not formed on a surface of the carrier.

5. The vapor deposition device according to claim 4, which uses a plurality of the carriers to:

transport the plurality of before-treatment wafers, through a factory interface, a load-lock chamber and a wafer transfer chamber, to the reaction chamber in that order; and transport a plurality of after-treatment wafers from the reaction chamber, through the wafer transfer chamber and the load-lock chamber to the factory interface in that order, wherein the load-lock chamber communicates with the factory interface via a first door and also communicates with the wafer transfer chamber via a second door, the wafer transfer chamber communicates, via a gate valve, with the reaction chamber, the wafer transfer chamber is provided with a first robot that deposits the before-treatment wafer transported into the load-lock chamber into the reaction chamber in a state where the before-treatment wafer is mounted on the carrier and also withdraws the after-treatment wafer for which treatment in the reaction chamber has ended from the reaction chamber in a state where the after-treatment wafer is mounted on the carrier and transports the after-treatment wafer to the load-lock chamber, the factory interface is provided with a second robot that extracts the before-treatment wafer from a wafer storage container and mounts the before-treatment wafer on the carrier standing by in the load-lock chamber, and also stores in the wafer storage container the after-treatment wafer mounted on the carrier that has been transported to the load-lock chamber, and the load-lock chamber is provided with a holder that supports the carrier.

6. The vapor deposition device according to claim 5, wherein the first robot deposits the carrier standing by in the load-lock chamber into the reaction chamber to mount on the susceptor in a state where the before-treatment wafer is not mounted on the carrier, the cleaning gas is supplied in a state that the reaction chamber is maintained at a cleaning temperature, the first robot transports the carrier that has been cleaned in the reaction chamber to the load-lock chamber, and thereafter the polysilicon film is formed on the surface of the susceptor by supplying reaction gas to the reaction chamber.

* * * * *